(12) United States Patent
Ogata et al.

(10) Patent No.: US 7,554,198 B2
(45) Date of Patent: Jun. 30, 2009

(54) FLEXIBLE JOINT METHODOLOGY TO ATTACH A DIE ON AN ORGANIC SUBSTRATE

(75) Inventors: Kazuo Ogata, Ibaraki (JP); Tsuyoshi Fukuo, Ibaraki (JP); Seiji Ishiyama, Ibaraki (JP); Tetsuhide Koh, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 11/479,633

(22) Filed: Jun. 29, 2006

(65) Prior Publication Data

US 2008/0001270 A1  Jan. 3, 2008

(51) Int. Cl.
*H01L 23/02* (2006.01)
*H01L 23/498* (2006.01)
*H01L 23/48* (2006.01)

(52) U.S. Cl. .............................. 257/737; 257/E23.065; 257/E23.067; 257/E23.069; 257/E23.023; 257/E23.068; 257/680; 257/784; 257/779; 257/780; 257/738; 257/778; 257/691; 257/698; 257/774; 257/773; 257/668

(58) Field of Classification Search ................. 257/737, 257/668, 678, 774, 773, 734, 738, 778, 691, 257/698, 696, 779, 780, 784, 680, E23.065, 257/E23.067, E23.069, E23.023, E23.068
See application file for complete search history.

(56) References Cited

U.S. PATENT DOCUMENTS

| 5,286,926 A | * | 2/1994 | Kimura et al. | 174/250 |
|---|---|---|---|---|
| 5,332,864 A | | 7/1994 | Liang et al. | |
| 5,691,041 A | * | 11/1997 | Frankeny et al. | 428/209 |
| 6,081,429 A | * | 6/2000 | Barrett | 361/767 |
| 6,103,554 A | | 8/2000 | Son et al. | |
| 6,376,769 B1 | | 4/2002 | Chung | |
| 6,399,892 B1 | * | 6/2002 | Milkovich et al. | 174/258 |
| 6,400,019 B1 | * | 6/2002 | Hirashima et al. | 257/737 |
| 6,525,407 B1 | | 2/2003 | Drewery | |
| 6,717,819 B1 | * | 4/2004 | Chung | 361/760 |
| 7,298,623 B1 | * | 11/2007 | Kuczynski et al. | 361/719 |
| 2002/0105092 A1 | * | 8/2002 | Coyle | 257/778 |
| 2002/0145204 A1 | * | 10/2002 | Naka et al. | 257/778 |
| 2003/0092218 A1 | * | 5/2003 | Jackson | 438/106 |

(Continued)

FOREIGN PATENT DOCUMENTS

JP          11-135217       *   5/1999

OTHER PUBLICATIONS

Pending U.S. Appl. No. 11/395,628, filed Mar. 31, 2006, Inventor: Fukuo, et al.

(Continued)

*Primary Examiner*—Alexander O Williams
(74) *Attorney, Agent, or Firm*—David L. Guglielmi

(57) ABSTRACT

In some embodiments, flexible joint methodology to attach a die on an organic substrate is presented. In this regard, an integrated circuit chip package substrate is introduced having an organic substrate, an interposer coupled with a surface of the organic substrate, the interposer having cavities to accept bumps of a die, and a flexible tape layer coupled with a surface of the interposer, the flexible tape layer to couple with bumps of the die. Other embodiments are also disclosed and claimed.

19 Claims, 2 Drawing Sheets

U.S. PATENT DOCUMENTS

| | | | |
|---|---|---|---|
| 2003/0146384 A1* | 8/2003 | Logsdon et al. | 250/338.1 |
| 2004/0217486 A1* | 11/2004 | Walter et al. | 257/779 |
| 2006/0000542 A1* | 1/2006 | Min et al. | 156/89.11 |
| 2006/0022328 A1 | 2/2006 | Lee | |
| 2006/0109632 A1* | 5/2006 | Berlin et al. | 361/719 |
| 2006/0284312 A1* | 12/2006 | Lee | 257/734 |
| 2007/0231970 A1 | 10/2007 | Fukuo et al. | |
| 2008/0000087 A1* | 1/2008 | Kuczynski et al. | 29/890.03 |

OTHER PUBLICATIONS

International Search Report for corresponding matter P24212PCT dated Nov. 17, 2007.

* cited by examiner

FLEXIBLE JOINT METHODOLOGY TO ATTACH A DIE ON AN ORGANIC SUBSTRATE

FIELD OF THE INVENTION

Embodiments of the present invention generally relate to the field of integrated circuit packages, and, more particularly to flexible joint methodology to attach a die on an organic substrate.

BACKGROUND OF THE INVENTION

The demand for enhanced performance and body size reduction of integrated circuit components continues to increase design and fabrication complexity due to the higher bandwidth requirements needed to enable higher clock frequencies. The substrates designed for these components will need to be manufactured with even smaller feature sizes to enable optimization of bandwidth. These smaller feature sizes are likely to lead to more occurrences of issues with conventional solder joints such as lagoon tail, miss-contact by small bumps, shorts to neighboring bumps, and voids in bumps.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
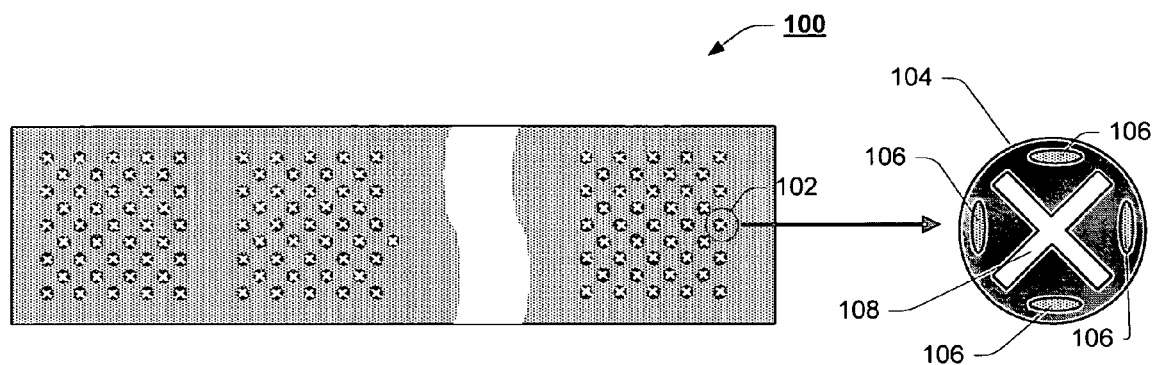
FIG. 1 is a graphical illustration of an overhead view of a flexible tape with contact points, in accordance with one example embodiment of the invention.

FIG. 1 is a graphical illustration of an overhead view of a flexible tape with contact points, in accordance with one example embodiment of the invention. In accordance with the illustrated example embodiment, flexible tape 100 includes one or more of contact point 102, plated area 104, via holes 106, and cross cut slits 108.

Flexible tape 100 represents a film or reeled tape comprising flexible dielectric material that has been processed to include contact points, such as contact point 102. In one embodiment, flexible tape 100 comprises polyimide tape with a thickness of 25 um, though other thicknesses may be selected by restitution (contact strength between a die bump and polyimide tape). In another embodiment, flexible tape 100 has a modulus of adhesion to maintain contact with bumps of an integrated circuit die. Flexible tape 100 may be processed as a reel and then cut into individual units for use with individual die or multiple dies.

Contact point 102 represents one of a plurality of contact points designed to couple with bumps of a die. Contact point 102 includes a plated area 104, via holes 106, and cross cut slits 108.

Plated area 104 provides electrical conductivity from the bump of the die to via holes 106. In one embodiment, plating area 104 comprises copper plating as the major conductive material and gold/nickel plating as a surface finish.

Via holes 106 provide electrical coupling from plated area 104 to the substrate below through the interposer, as described in greater detail in reference to FIGS. 2 & 3. While four via holes 106 are shown in FIG. 1, any number and any shape of via holes may be utilized so as provide adequate electrical conductivity. In one embodiment, via holes 106 are filled with gold or a gold alloy. In another embodiment, via holes 106 are filled with nickel or a nickel alloy.

Cross cut slits 108 represent a pattern cut through flexible tape 100 to create flaps that can move down when a die bump is placed from above. As shown, cross cut slits 108 are x-shaped creating four flaps, however other shaped cross cut patterns may be utilized to create two or more flaps. In one embodiment, cross cut slits 108 are created by mechanical punching. In another embodiment, cross cut slits 108 are created by laser ablation.

Figure 2:
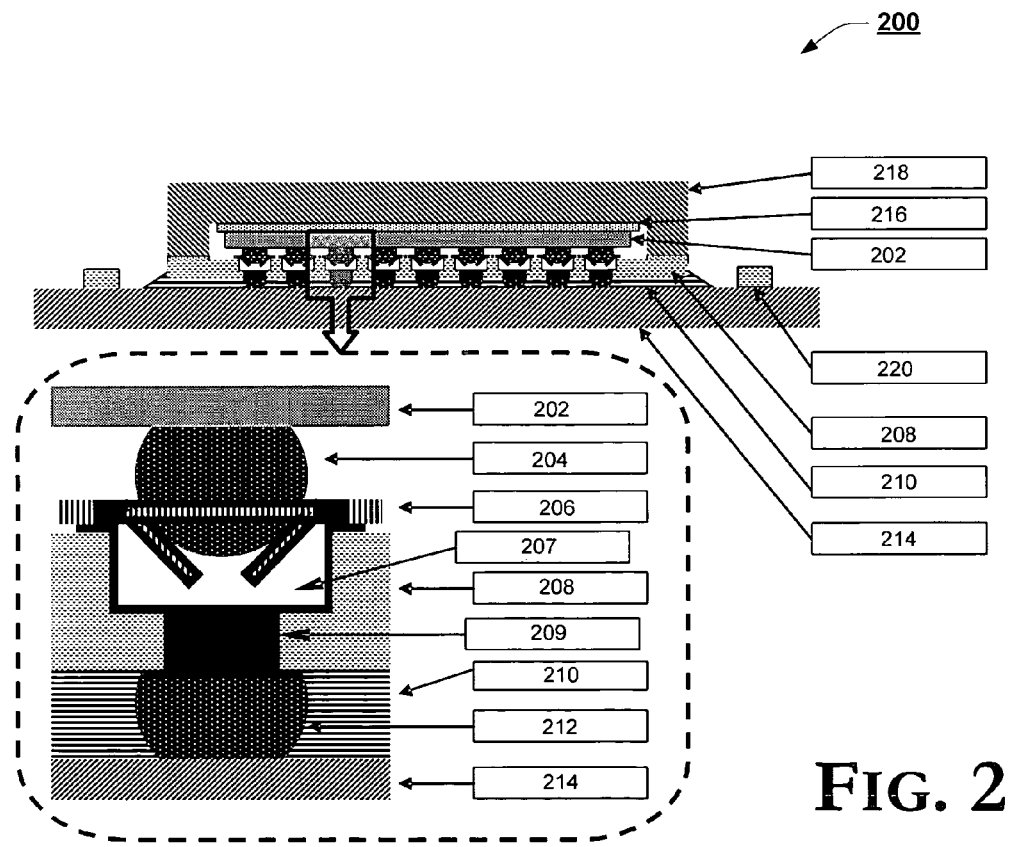
FIG. 2 is a graphical illustration of a cross-sectional view of an integrated circuit package with a flexible joint, in accordance with one example embodiment of the invention.

FIG. 2 is a graphical illustration of a cross-sectional view of an integrated circuit package with a flexible joint, in accordance with one example embodiment of the invention. As shown, integrated circuit package 200 includes die 202, die bump 204, flexible tape 206, cavity 207, interposer 208, via 209, underfill 210, substrate bump 212, substrate 214, thermal interface material (TIM) 216, integrated heat spreader (IHS) 218, and capacitor 220.

Die 202 represents any type of integrated circuit, including, but not limited to, a microprocessor, a controller, a communications processor, or a graphics processor. As part of a manufacturing process die 202 may have die bump 204 among a plurality of solder bumps formed on one side.

In one embodiment, flexible tape 206, including contacts points such as contact point 102, is aligned with and attached to interposer 208, before die 202 is coupled to flexible tape 206. In one embodiment, a gold surface of flexible tape 206, for example via holes 106, bond with a gold surface of interposer 208.

Interposer 208 may be ceramic or another dielectric material which provides mechanical support between die 202 and substrate 214. Interposer 208 includes cavities, such as cavity 207 that can at least partially receive die bump 204 and flaps of flexible tape 206. Cavity 207 is plated with a conductive metal, such as gold or nickel or copper or silver or tungsten, to electrically couple die bump 204 to substrate 214. In one embodiment, interposer 208 also includes via 209, which is filled with a conductive metal or alloy to electrically couple with substrate 214.

In one embodiment, substrate bump 212 is formed on via 209 of interposer 208, and interposer 208 is coupled with substrate 214 through conventional soldering and underfill 210. In another embodiment, substrate bump 212 is formed on substrate 214 and is soldered to via 209.

In one embodiment, die 202 is positioned and pressed down such that bump 204 is aligned of a contact point of flexible tape 206, which is aligned with cavity 207, forming a flexible, non-soldered, joint. Thereafter, thermal interface material 216 may be applied to a surface of die 202 to adhere with integrated heat spreader 218.

While shown in a package, the flexible joint shown in FIG. 2 may be implemented in varying levels of completeness and complexity. For example, interposer 208 may be formed in an organic layer of substrate 214.

Figure 3:
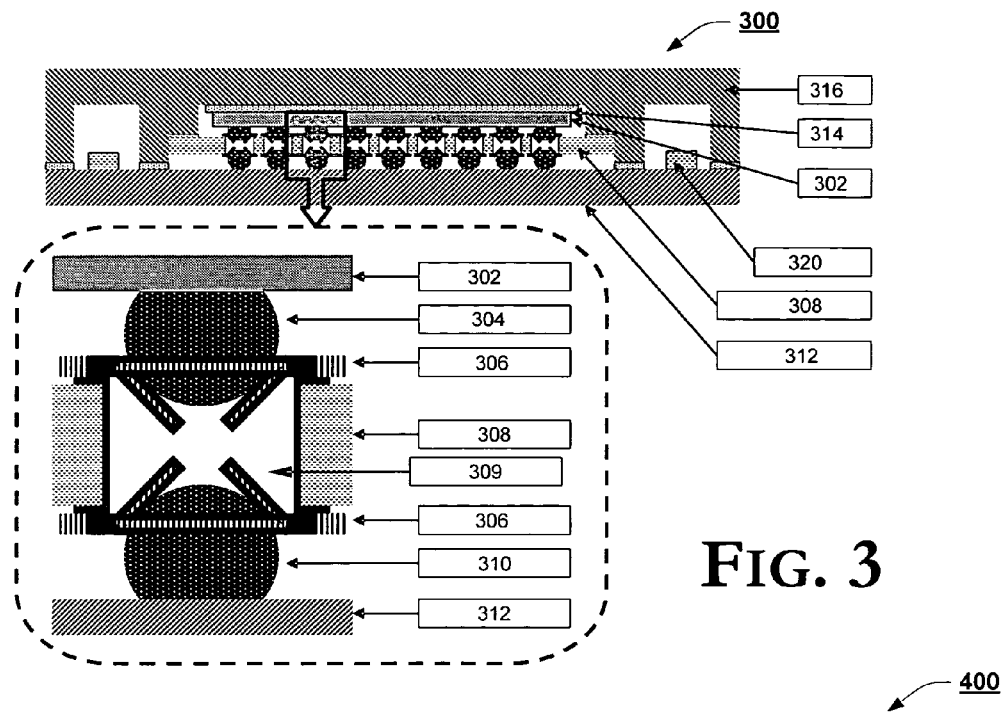
FIG. 3 is a graphical illustration of a cross-sectional view of an integrated circuit package with a flexible joint, in accordance with one example embodiment of the invention.

FIG. 3 is a graphical illustration of a cross-sectional view of an integrated circuit package with a flexible joint, in accordance with one example embodiment of the invention. As shown, integrated circuit package 300 includes die 302, die bump 304, flexible tape layers 306, interposer 308, cavity 309, substrate bump 310, substrate 312, TIM 314, IHS 316, and capacitor 320.

In this embodiment, two flexible tape layers 306 are bonded on separate surfaces of interposer 308, one to couple with die bump 304 and the other to couple with substrate bump 310. In this embodiment, cavity 309 of interposer 308 extends to both flexible tape layers 306, flaps of which extend into cavity 309.

Figure 4:
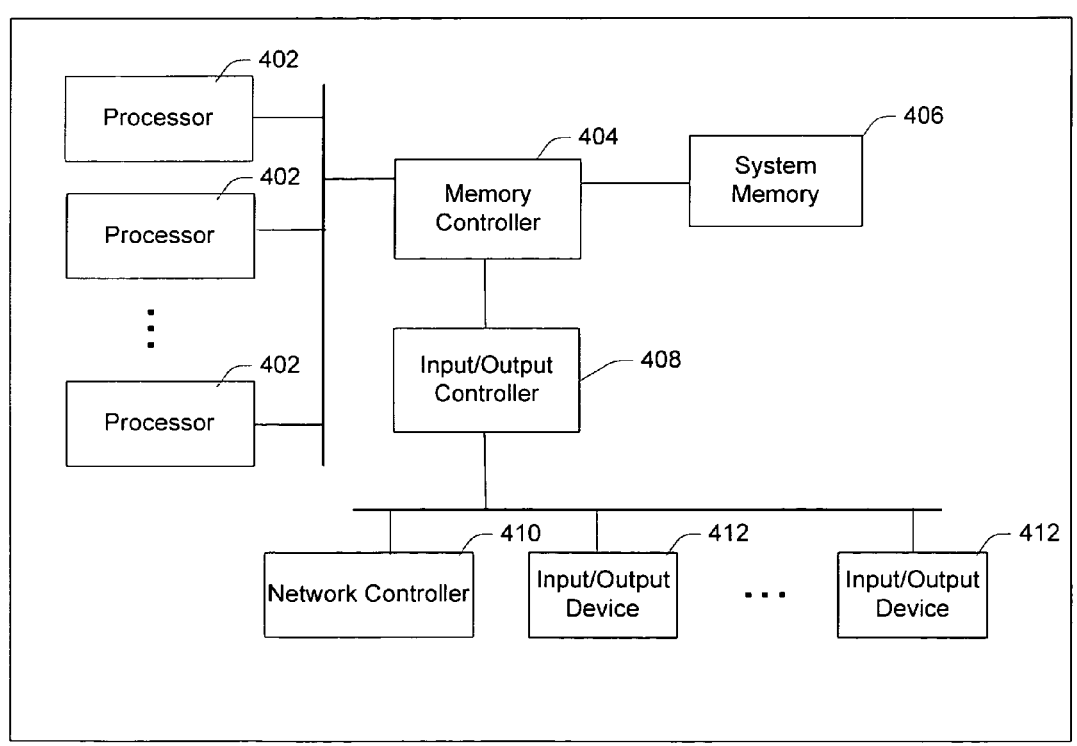
FIG. 4 is a block diagram of an example electronic appliance suitable for implementing an integrated circuit package with a flexible joint, in accordance with one example embodiment of the invention.

FIG. 4 is a block diagram of an example electronic appliance suitable for implementing an integrated circuit package with a flexible joint, in accordance with one example embodiment of the invention. Electronic appliance 400 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 400 may include one or more of processor(s) 402, memory controller 404, system memory 406, input/output controller 408, network controller 410, and input/output device(s) 412 coupled as shown in FIG. 5. Processor(s) 402, or other integrated circuit components of electronic appliance 400, may be housed in a package including a flexible joint described previously as an embodiment of the present invention.

Processor(s) 402 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 402 are Intel® compatible processors. Processor(s) 402 may have an instruction set containing a plurality of machine level instructions that may be invoked, for example by an application or operating system.

Memory controller 404 may represent any type of chipset or control logic that interfaces system memory 406 with the other components of electronic appliance 400. In one embodiment, the connection between processor(s) 402 and memory controller 404 may be referred to as a front-side bus. In another embodiment, memory controller 404 may be referred to as a north bridge.

System memory 406 may represent any type of memory device(s) used to store data and instructions that may have been or will be used by processor(s) 402. Typically, though the invention is not limited in this respect, system memory 406 will consist of dynamic random access memory (DRAM). In one embodiment, system memory 406 may consist of Rambus DRAM (RDRAM). In another embodiment, system memory 406 may consist of double data rate synchronous DRAM (DDRSDRAM).

Input/output (I/O) controller 408 may represent any type of chipset or control logic that interfaces I/O device(s) 412 with the other components of electronic appliance 400. In one embodiment, I/O controller 408 may be referred to as a south bridge. In another embodiment, I/O controller 408 may comply with the Peripheral Component Interconnect (PCI) Express™ Base Specification, Revision 1.0a, PCI Special Interest Group, released Apr. 15, 2003.

Network controller 410 may represent any type of device that allows electronic appliance 400 to communicate with other electronic appliances or devices. In one embodiment, network controller 410 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 410 may be an Ethernet network interface card.

Input/output (I/O) device(s) 412 may represent any type of device, peripheral or component that provides input to or processes output from electronic appliance 400.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An integrated circuit chip package substrate comprising:
   an organic substrate;
   an interposer coupled with a surface of the organic substrate, the interposer having a plurality of metal-plated cavities to accept bumps of a die; and
   a flexible tape layer coupled with a surface of the interposer, the flexible tape to conductively couple with and adhere to bumps of the die, the flexible tape having conductive vias coupled with the metal-plated cavities.

2. The integrated circuit chip package substrate of claim 1, further comprising the flexible tape including slits creating flaps that fold into the cavities when coupled with bumps of the die.

3. The integrated circuit chip package substrate of claim 1, wherein the interposer comprises ceramic material.

4. The integrated circuit chip package substrate of claim 1, wherein the interposer comprises plating of a metal chosen from the group consisting of: nickel, copper, gold, silver, tungsten, and conductive alloys.

5. The integrated circuit chip package substrate of claim 1, wherein the interposer comprises a layer of the substrate.

6. The integrated circuit chip package substrate of claim 1, wherein the interposer is coupled with bumps on the surface of the organic substrate through a second flexible tape layer.

7. The integrated circuit chip package substrate of claim 1, wherein the flexible tape couples with the interposer through a gold-to-gold bond.

8. An apparatus comprising:
   an integrated circuit die, the integrated circuit die including bumps for electrical coupling;
   a thermal interface material layer deposited on a surface of the die;
   an integrated heat spreader coupled with the thermal interface material layer;
   a flexible tape layer conductively coupled with and adhered to the bumps of the die, the flexible tape having conductive vias to conductively couple the bumps with contacts on an opposing side of the flexible tape; and
   an interposer, the interposer including a plurality of metal-plated cavities to at least partially receive the bumps of the die.

9. The apparatus of claim 8, further comprising the flexible tape including slits creating flaps that fold into the cavities of the interposer.

10. The apparatus of claim 9, wherein the slits comprise an x-shaped cross cut creating four flaps.

11. The apparatus of claim 8, further comprising the interposer including bumps to couple with a substrate.

12. The apparatus of claim 8, wherein the interposer comprises ceramic material.

13. The apparatus of claim 8, wherein the interposer comprises plating with one or more metals chosen from the group consisting of: nickel, copper, gold, silver, tungsten, and alloys containing nickel, copper, gold, silver or tungsten.

14. An electronic appliance comprising:
   a network controller;
   a system memory; and
   a processor, wherein the processor comprises: a die including bumps, a flexible tape layer including contact areas adhered to and conductively coupled with the bumps, a ceramic interposer including metal-plated cavities to at least partially receive the bumps and to conductively couple with vias in the flexible tape layer, and a substrate coupled with the interposer.

15. The electronic appliance of claim 14, wherein the flexible tape layer comprises polyimide tape having a thickness of 25 um.

16. The electronic appliance of claim 14, wherein the contact areas comprise x-shaped cross cuts including four flaps.

17. The electronic appliance of claim 14, further comprising the interposer including bumps that are soldered to the substrate.

18. The electronic appliance of claim 14, further comprising a second flexible tape layer that couples the substrate with the interposer.

19. The electronic appliance of claim 14, wherein the flexible tape couples with the interposer through a gold-to-gold bond.

\* \* \* \* \*